(12) United States Patent
Chen

(10) Patent No.: US 7,854,245 B2
(45) Date of Patent: Dec. 21, 2010

(54) METHOD FOR FORMING RADIO FREQUENCY IDENTIFICATION TAG ON PACKING BAG AND DEVICE THEREFOR

(75) Inventor: Yung-Shun Chen, Chung Li (TW)

(73) Assignee: Taiwan Lamination Industries, Inc., Chung Li (TW)

( * ) Notice: Subject to any disclaimer, the term of this patent is extended or adjusted under 35 U.S.C. 154(b) by 216 days.

(21) Appl. No.: 12/232,408

(22) Filed: Sep. 17, 2008

(65) Prior Publication Data

US 2009/0126861 A1    May 21, 2009

(30) Foreign Application Priority Data

Nov. 21, 2007  (TW) .............................. 96144033 A

(51) Int. Cl.
*B65B 9/02* (2006.01)
*B65B 9/06* (2006.01)
*B29C 65/02* (2006.01)

(52) U.S. Cl. ........................ 156/542; 156/464; 156/466; 156/544; 156/552; 156/308.4; 156/196

(58) Field of Classification Search ................... 53/545, 53/547, 548, 553; 156/196, 309.4, 461, 463–466, 156/540–544, 552
See application file for complete search history.

(56) References Cited

U.S. PATENT DOCUMENTS

| | | | | |
|---|---|---|---|---|
| 3,850,775 A | * | 11/1974 | Bruneau et al. | 156/463 |
| 6,251,209 B1 | * | 6/2001 | Johnson | 156/256 |
| 7,416,628 B2 | * | 8/2008 | Carver et al. | 156/249 |
| 2004/0188010 A1 | * | 9/2004 | Chaoui | 156/269 |

FOREIGN PATENT DOCUMENTS

EP           1583048       * 10/2005

* cited by examiner

*Primary Examiner*—Kat Wyrozebski
*Assistant Examiner*—Scott W Dodds
(74) *Attorney, Agent, or Firm*—Bacon & Thomas, PLLC.

(57) ABSTRACT

A method for forming a radio frequency identification (RFID) tag on a packing bag is disclosed and includes the steps of: equidistantly attaching RFID tags to a release film, one by one, to form a roll of tag web; installing the roll of tag web in a packing bag forming device to move the release film along a feeding direction of a packing material; changing a moving direction of the release film for peeling the RFID tags from the release film; intermittently pressing on the RFID tags for attaching the RFID tags to the packing material; bonding the RFID tags to the packing material with a melting technology; and processing the packing material by folding, sealing, and cutting to form packing bags securely installed with the RFID tags. A packing bag forming device for carrying out the method is also disclosed.

7 Claims, 10 Drawing Sheets

US 7,854,245 B2

METHOD FOR FORMING RADIO FREQUENCY IDENTIFICATION TAG ON PACKING BAG AND DEVICE THEREFOR

FIELD OF THE INVENTION

The present invention relates to a method for forming a radio frequency identification (RFID) tag and a device therefor, and more particularly, to a method for forming an RFID tag on a packing bag and a device therefor.

BACKGROUND OF THE INVENTION

The so-called "radio frequency identification (RFID)" technology, i.e., an identification tag using radio frequency, is a communication technology applied to an identification system, so that the identification system can identify a specific object through radio signals and read/write related data from/ into the specific object without any mechanical or optical connection between the identification system and the specific object. Generally, an RFID tag comprises an antenna and a chip, wherein the antenna has two functions: one function is to receive an electromagnetic wave transmitted from a reader for driving the chip, and the other function is to generate binary data of 0 and 1 by switching the impedance of the antenna when the RFID tag sends back signals. The chip is connected to input ends of the antenna. The RFID technology can be divided into a passive type, a semi-passive type, and an active type, each type having a different property. In the present invention, the RFID tag described hereinafter is mainly the passive RFID tag, which is a mainstream product in the RFID tag market. The passive RFID tag is not provided with any internal power source, and its chip is driven by an electromagnetic wave received by its antenna, wherein the electromagnetic wave is transmitted by an RFID reader of an identification system. When the RFID tag receives enough signals, data stored in the chip will be transmitted to the RFID reader. The passive RFID tag has a low cost, can operate without any power source, and therefore becomes the mainstream product in the RFID tag market.

The RFID tag has ample applications, as determined mainly by the economic benefits it offers in related fields. Specifically, the applications of the RFID tag include:
(1) anti-counterfeit measures for banknotes and products;
(2) identification cards and pass cards (including tickets);
(3) electronic toll collection systems, such as OCTOPUS cards of Hong Kong and EasyCards of Taiwan;
(4) identification of livestock or wildlife animals; and
(5) patient identification and electronic medical records.

Besides, the applications of the RFID tag further comprise logistics management for carrying out real-time monitoring of all links in a supply chain, including product design; raw material procurement; fabrication, transportation, storage, delivery, sales of semi-finished and finished products; and even product return management and after-sales services, so as to precisely control product-related information such as product types, manufacturers, time of manufacture, locations, colors, sizes, quantities, destinations, receivers and so forth.

Referring now to FIG. 1, wherein a widely used, traditional RFID tag 10 is illustrated, the RFID tag 10 comprises an antenna 20 and a chip 30, both of which are provided on a polyimide substrate 40. The manufacturing method of the RFID tag 10 comprises the steps of: attaching a copper foil 41 to a side surface of the polyimide substrate 40, so as to form a flexible copper-clad laminate; etching the copper foil 41 to form the desired antenna 20; and connecting the chip 30 to input ends 21 of the antenna 20, thereby finishing the RFID tag 10. Before the RFID tag can be used in the logistics management of products, it is necessary to process the packing bags of the products with an additional processing procedure for attaching the RFID tag to an outer surface of the packing bags. As a result, the processing cost of the products is increased, while the exterior design of the packing bags is disadvantageously affected. Even the RFID tag itself may be damaged or peeled off during product processing or transportation due to improper attachment of the RFID tag.

Hence, it is important for related manufacturers to find ways to form RFID tags on packing bags while manufacturing the packing bags, in order to substantially reduce the production cost of the RFID tags, and to manufacture various kinds packing bags formed with the RFID tags without increasing the processing cost, and impairing the exterior design, of the packing bags

SUMMARY OF THE INVENTION

In view of the problem with a traditional packing bag formed with an RFID tag that the packing bag requires an additional process for attaching the RFID tag to an outer surface of the packing bag, thereby increasing the processing cost, and impairing the exterior design, of the packing bag, the inventor of the present invention did extensive research and finally succeeded in developing a method for forming a radio frequency identification (RFID) tag on a packing bag and a device therefore, as disclosed herein.

A primary object of the present invention is to provide a method for forming an RFID tag on a packing bag, wherein the method includes the steps of: equidistantly attaching a plurality of radio frequency identification (RFID) tags to a strip-like release film, one by one, in a longitudinal arrangement, and rolling the strip-like release film on a reel to form a roll of tag web; installing the roll of tag web in a packing bag forming device, so that the release film is moved along a feeding direction of a packing material in the packing bag forming device; changing a moving direction of the release film when the release film approaches a side surface of the packing material, so that the release film is moved along a reverse direction of the feeding direction of the packing material, thereby peeling the RFID tags from the release film due to an abrupt change of the moving direction of the release film, while the peeled RFID tags continue to move along the feeding direction of the packing material; intermittently pressing on an upper surface of the RFID tags peeled from the release film, so as to attach the RFID tags to the side surface of the packing material with an adhesive layer on a lower surface of the RFID tags; bonding a substrate portion of the RFID tags that is provided with neither an antenna nor a chip, to the packing material with a melting technology (such as high-frequency melting or thermo-pressure melting) in a following process, so as to secure and equidistantly and longitudinally arrange the RFID tags at predetermined positions on the side surface of the packing material one by one; and finally, using the packing bag forming device to fold, seal, and cut the packing material (i.e., a traditional forming process), so as to consistently form a plurality of packing bags, each of which has an outer or inner side surface securely installed with one of the RFID tags at a predetermined position thereon. The method of the present invention is simple, rapid, and advantageous in substantially lowering production cost. Besides, the RFID tags can be optionally mounted inside each of the packing bag, so as to provide the best protection for the RFID tags without impairing the exterior design of the packing bags. Meanwhile, the present invention can prevent the RFID tags from being damaged during feeding, handling, and transporting operations, so as to optimize product identification efficiency of the RFID tags.

A secondary object of the present invention is to provide a packing bag forming device for forming an RFID tag on a packing bag, wherein the packing bag forming device comprises a tag peeling mechanism, a tag transferring mechanism, a tag fixing mechanism, a folding mechanism, a sealing mechanism, and a cutting mechanism. The tag peeling mechanism comprises a plurality of rollers and a separation plate, wherein the rollers are used to guide a release film of a roll of tag web to a first side of the separation plate for moving the release film along a feeding direction of a packing material in the packing bag forming device, and to guide the release film to a second side of the separation plate when the release film approaches a side surface of the packing material, so as to move the release film along a reverse direction of the feeding direction of the packing material, thereby peeling RFID tags equidistantly and longitudinally arranged on the release film from the release film due to an abrupt change of a moving direction of the release film, while the peeled RFID tags continue to move along the feeding direction of the packing material. The tag transferring mechanism comprises a pressing roller and a driving element, wherein the pressing roller is disposed at a position adjacent to an end edge of the separation plate, and controlled by the driving element, so as to regularly and intermittently move. When one of the RFID tags is peeled from the release film, the pressing roller can shift and abut against an upper surface of the RFID tag, so that an adhesive layer on a lower surface of the RFID tag is attached to the side surface of the packing material due to a pressing force of the pressing roller. The tag fixing mechanism comprises a melting mold (such as mold for high-frequency melting or a mold for thermo-pressure melting) and a forming plate, wherein the melting mold is disposed at a position corresponding to the forming plate, for bonding a substrate portion of the RFID tag that is provided with neither an antenna nor a chip to the packing material with a melting technology (such as high-frequency melting or thermo-pressure melting) when the RFID tag and the packing material are passed through between the melting mold and the forming plate, so as to secure and equidistantly and longitudinally arrange the RFID tags at predetermined positions on the side surface of the packing material. The folding mechanism is used to fold the packing material so that the packing material covers two side surfaces of the forming plate, thereby allowing one of two side surfaces of the packing material that is attached with the RFID tags to be folded and therefore become an outer or inner side surface of a packing bag. Meanwhile, two opposite side edges of the packing material are folded to overlap each other. The sealing mechanism is used to seal the two opposite side edges of the packing material with a melting technology (such as high-frequency melting or thermo-pressure melting), so as to continuously form a plurality of packing bags on the packing material, wherein each of the packing bags has an outer or inner side surface securely installed with one of the RFID tags at a predetermined position thereon. The cutting mechanism is used to cut off, one by one, the packing bags which are longitudinally linked one after another. The packing bag forming device of the present invention is characterized by the tag peeling mechanism, the tag transferring mechanism, and the tag fixing mechanism, while the remaining mechanisms are mechanisms conventionally used in a traditional packing bag forming device. In other words, the present invention can be implemented simply by adding the tag peeling mechanism, the tag transferring mechanism, and the tag fixing mechanism to a traditional packing bag forming device, without having to substantially change an existing design of the traditional packing bag forming device. Thus, the packing bag forming device of the present invention can be provided with a lowest production cost and a shortest retrofitting time. As a result, the present invention can carry out a consistent operation to not only form packing bags, but also simultaneously form RFID tags at predetermined positions on an outer or inner side surface of the packing bags.

BRIEF DESCRIPTION OF THE DRAWINGS

The structure and technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
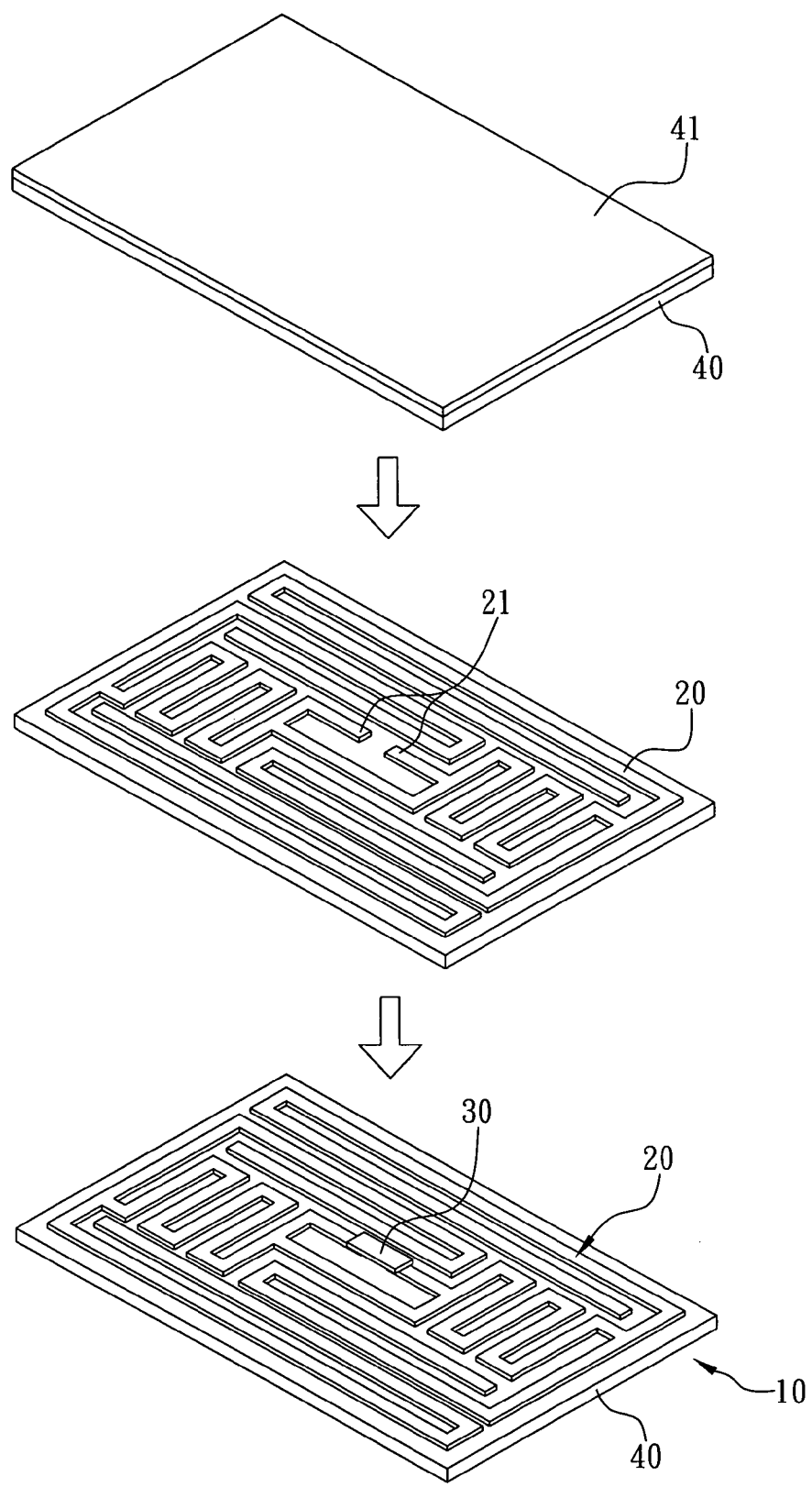
FIG. 1 is a flowchart of a manufacturing process of a traditional RFID tag.
Figure 2:
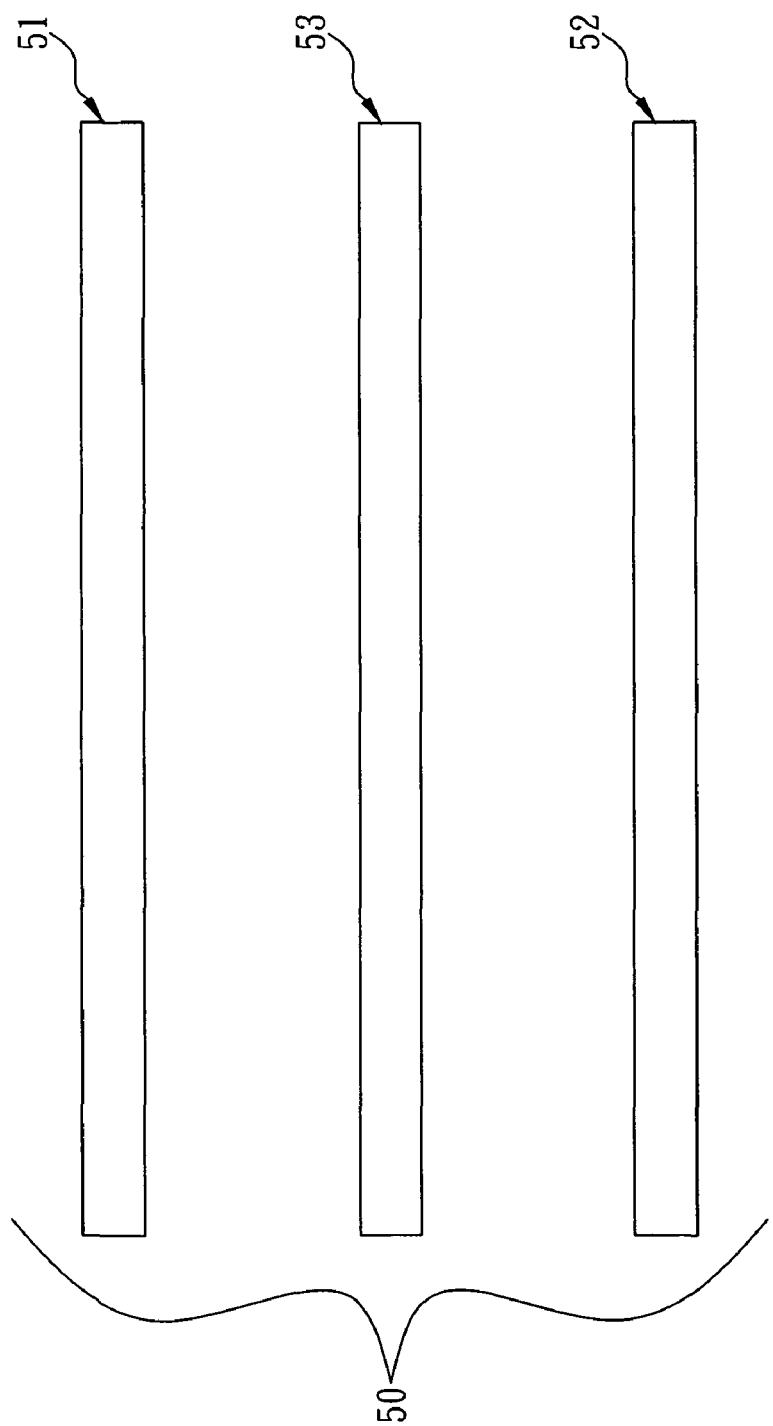
FIG. 2 is a schematic structural drawing of a traditional packing material.
Figure 3:
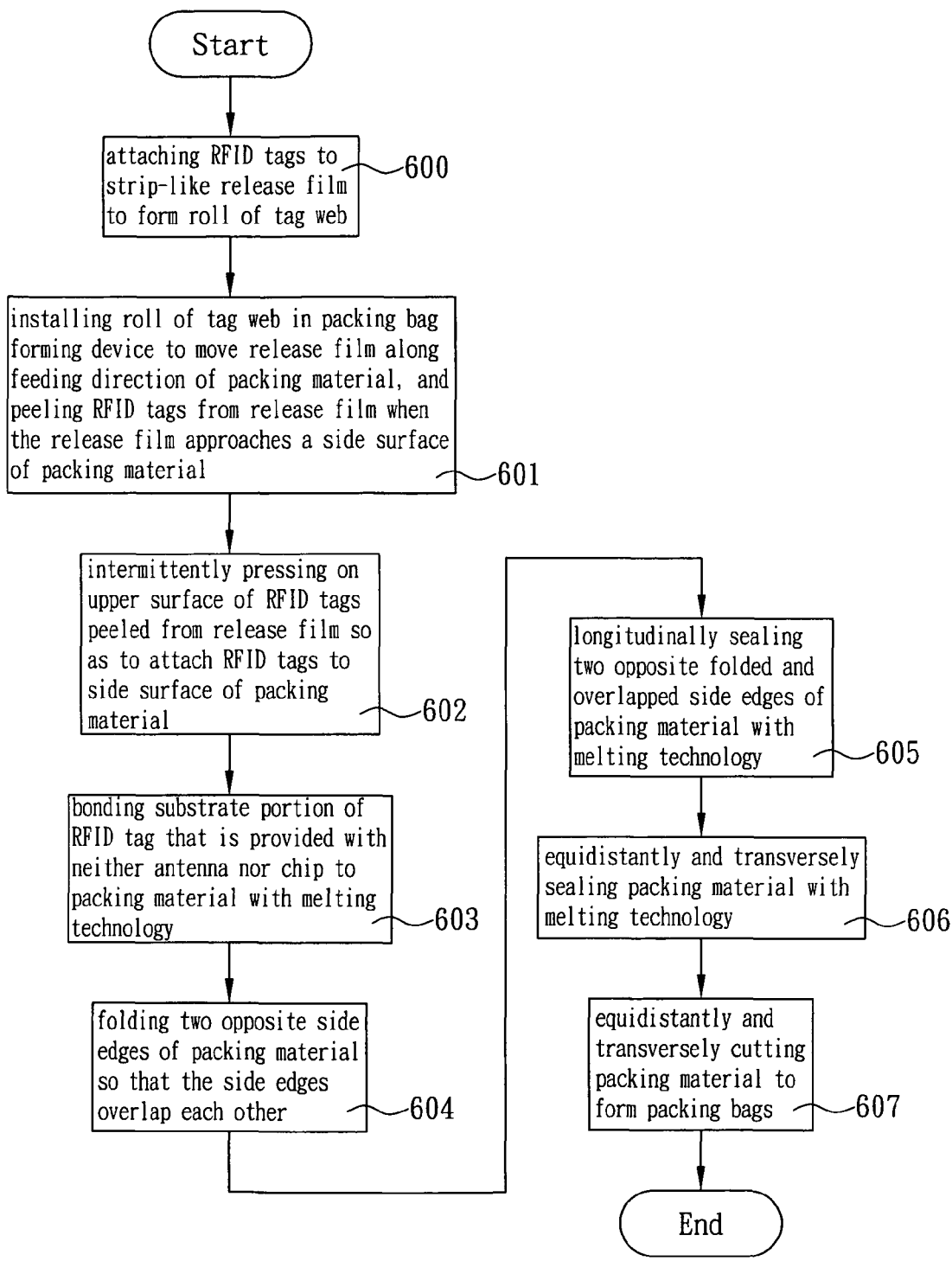
FIG. 3 is a flowchart of a method for forming an RFID tag on a packing bag according to a preferred embodiment of the present invention.

The present invention is related to a method for forming a radio frequency identification (RFID) tag on a packing bag and a device therefor, which are applied mainly to a process for forming a packing bag. Referring now to FIG. 2, a packing bag is formed of a packing material, wherein the packing material is a general film material comprising a surface material 51, a base material 52, and an adhesive layer 53. The surface material 51 is a transparent or opaque film made of a plastic material, such as oriented polypropylene (OPP) or polyethylene terephthalate (PET), or other fabric or paper. The base material 52 is a transparent or opaque film made of a plastic material, such as polyethylene (PE) or polypropylene (PP), or other fabric or paper. The adhesive layer 53 is a layer of glue for coupling the surface material 51 and the base material 52 into one piece, which is defined as a packing material 50 of the present invention. However, the packing material 50 is only one of possible embodiments of the present invention; implementation of the present invention is not limited thereto. In an alternative embodiment, the packing material of the present invention can be optionally made only of a transparent or opaque plastic film such as PE or PP. Referring to FIG. 3, in a preferred embodiment of the present invention, the method comprises the following steps.

Figure 4:
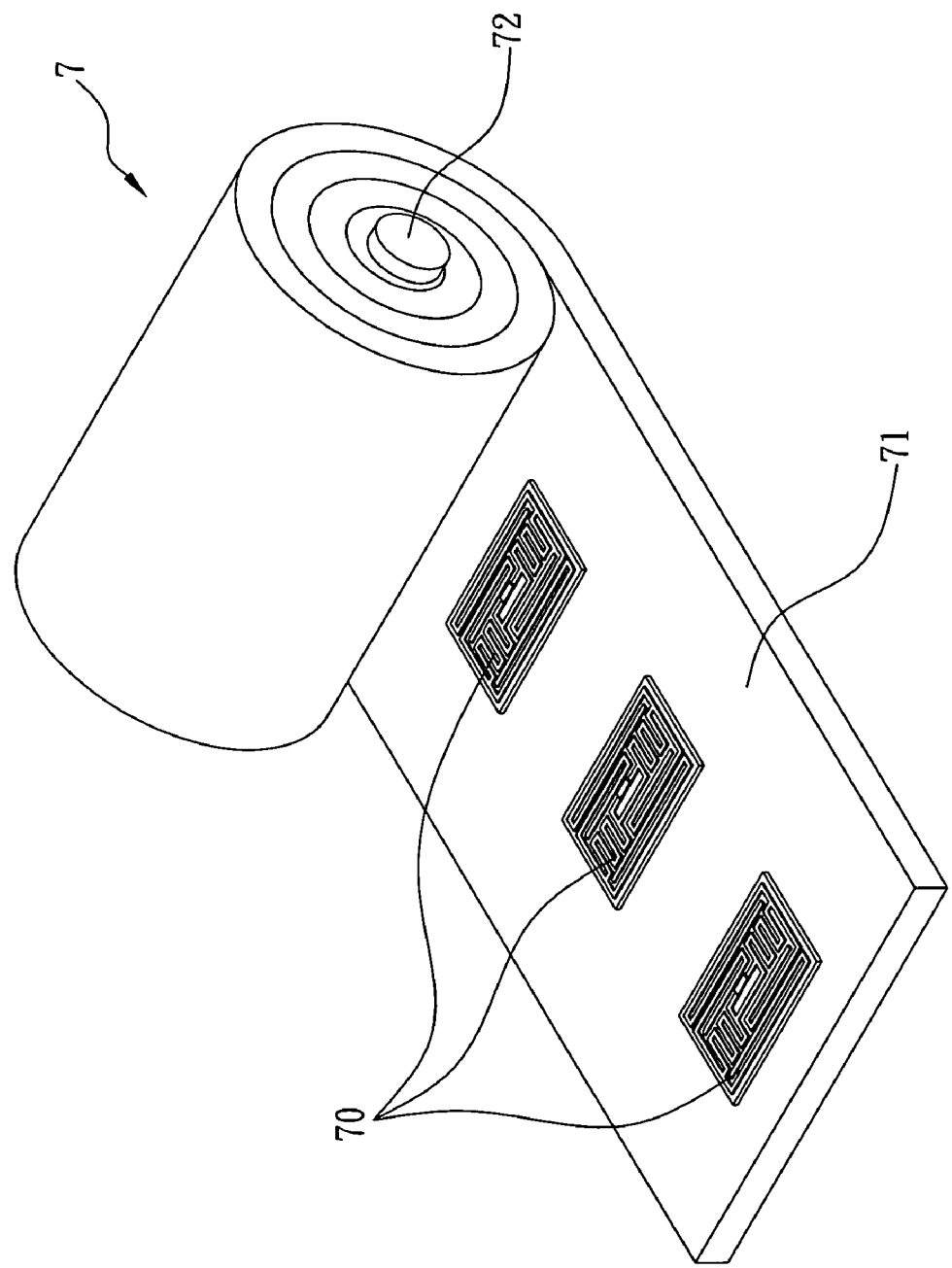
FIG. 4 is a schematic structural drawing of a roll of tag web according to the preferred embodiment of the present invention.

In a step (600), referring now to FIG. 4, a plurality of radio frequency identification (RFID) tags 70 are equidistantly attached to a strip-like release film 71, one by one, in a longitudinal arrangement, and the strip-like release film 71 is rolled on a reel 72 to form a roll of tag web 7.

Figure 5:
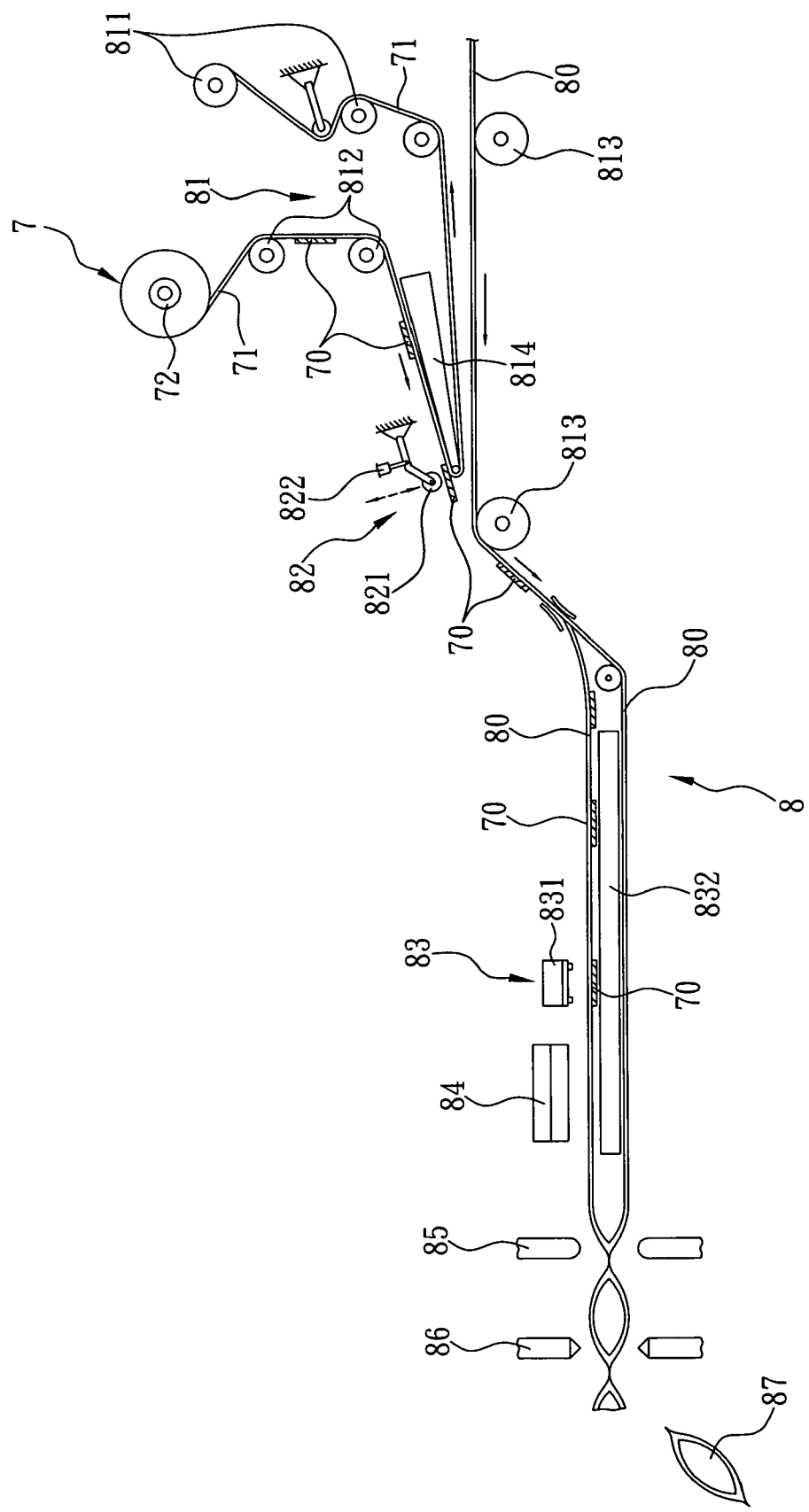
FIG. 5 is a schematic structural drawing of a device for forming an RFID tag on a packing bag according to the preferred embodiment of the present invention.
Figure 6:
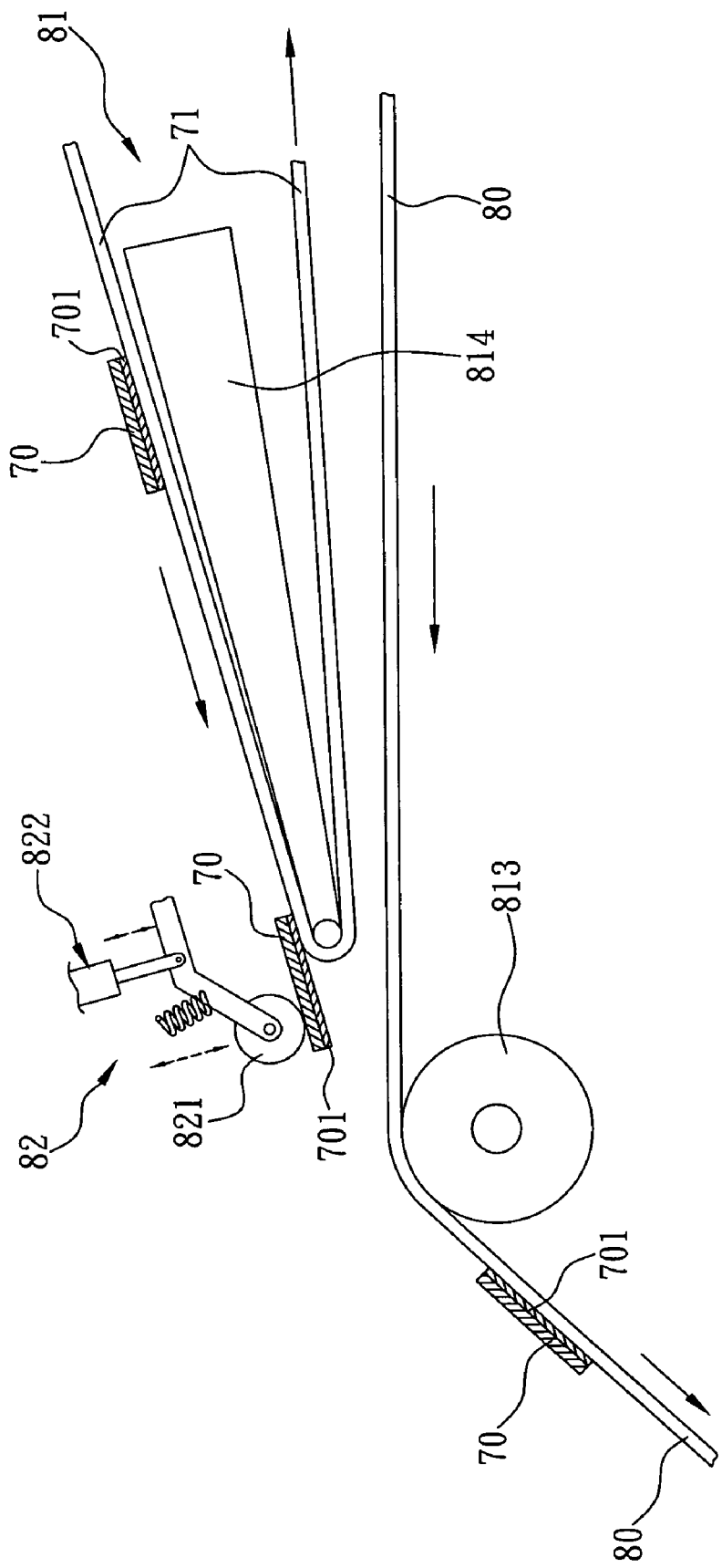
FIG. 6 is a partially enlarged view of the device for forming an RFID tag on a packing bag according to the preferred embodiment of the present invention.

In a step (601), referring now to FIGS. 5 and 6, the roll of tag web 7 is installed in a packing bag forming device 8, so that the release film 71 is moved along a feeding direction of a packing material 80 in the packing bag forming device 8. A moving direction of the release film 71 is changed when the release film 71 approaches a side surface of the packing material 80, so that the release film 71 is moved along a reverse direction of the feeding direction of the packing material 80, thereby peeling the RFID tags 70 from the release film 71 due to an abrupt change of the moving direction of the release film 71, while the peeled RFID tags 70 continue to move along the feeding direction of the packing material 80.

In a step (602), referring still to FIGS. 5 and 6, a tag transferring mechanism 82 is driven to intermittently press on an upper surface of the RFID tags 70 peeled from the release film 71, so as to attach the RFID tags 70 to the side surface of the packing material 80 with an adhesive layer 701 on a lower surface of the RFID tags 70;

In a step (603), referring still to FIG. 5, a tag fixing mechanism 83 is driven to bond a substrate portion of the RFID tags 70 that is provided with neither an antenna nor a chip to the packing material 80 with a melting technology (such as high-frequency melting or thermo-pressure melting), so as to secure and equidistantly and longitudinally arrange the RFID tags 70 at predetermined positions on the side surface of the packing material 80, one by one.

In a step (604), the packing material 80 is folded by a folding mechanism of the packing bag forming device 8. (The folding process is a traditional process, while the folding mechanism is a traditional mechanism that does not constitute a major feature of the present invention and is therefore not shown in FIG. 5.) As a result, referring now to FIG. 7, two opposite side edges 801 of the packing material 80 are folded to overlap each other, so that the packing material 80 is longitudinally folded into a cylindrical packing material for forming a side sealed portion. Alternatively, referring now to FIG. 8, the packing material 80 can be folded into a cylindrical packing material for forming a central sealed portion. Hence, the side surface of the packing material 80 that is installed with the RFID tags 70 becomes an outer or inner side surface of the cylindrical packing material. The embodiments shown in FIGS. 7 and 8 only demonstrate a case where the RFID tags 70 are mounted on an inner side surface of the cylindrical packing material In a step (605), referring back to FIG. 5, a first sealing mechanism 84 of the packing bag forming device 8 is driven to longitudinally seal the two opposite folded and overlapped side edges 801 of the packing material 80 (to form a side sealed portion or a central sealed portion) with a melting technology (such as high-frequency melting or thermo-pressure melting). Thus, referring back to FIGS. 7 and 8, the packing material 80 is longitudinally sealed to form the cylindrical packing material.

In a step (606), referring back to FIG. 5, a second sealing mechanism 85 of the packing bag forming device 8 is driven to equidistantly and transversely seal the cylindrical packing material with a melting technology, so as to continuously form semi-finished products of a plurality of packing bags on the packing material 80.

In a step (607), referring still to FIG. 5, a cutting mechanism 86 of the packing bag forming device 8 is driven to equidistantly and transversely cut off the packing material 80, so as to consistently form a plurality of packing bags 87, each of which has an outer or inner side surface securely installed with one of the RFID tags 70 at a predetermined position thereon.

Therefore, according to the present invention, related manufacturers can form the packing bags 87 while forming the RFID tags 70 on the outer or inner side surface of the packing bags 87. The method of the present invention is not only simple and rapid, but also capable of substantially lowering manufacturing and processing cost. Besides, the RFID tags 70 can be completely covered by being mounted on an inner side surface of the packing bags 87 as needed, without impairing the exterior design of products or the packing bags 87. Meanwhile, the packing bags 87 can protect the RFID tags 70 from being damaged during feeding, handling and transporting operations, so as to provide the best protection for the RFID tags 70, thereby optimizing product identification efficiency of the RFID tags 70. Hence, the packing bags 87 can be provided to designers and manufacturers of all kinds of products for accommodating various products that need to be installed with RFID tags. In this way, during logistics management of the products, the manufacturers can use data provided by the RFID tags on the products to carry out real-time monitoring and management of all links in a supply chain, including product fabrication, transportation, storage, delivery, sales, and even product return management and after-sales services, so as to effectively enhance the efficiency of logistics management and substantially lower the management and distribution cost thereof.

Figure 9:
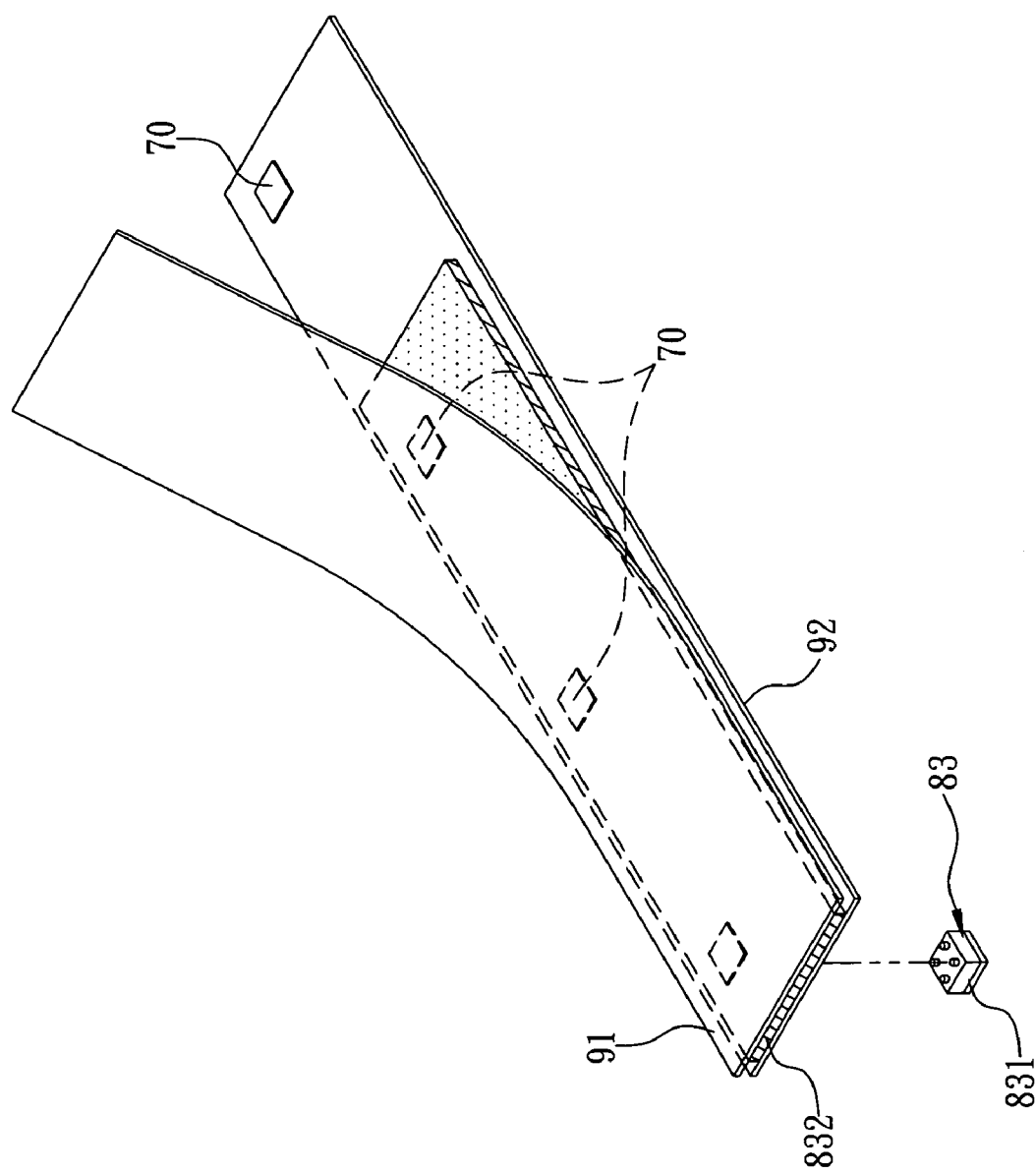
FIG. 9 is a schematic view of two layers of packing material used to form packing bags according to a preferred embodiment of the present invention.

It should be noted that the foregoing method is only one of embodiments of the present invention. Implementation of the present invention is not limited to the embodiment described above. In alternative embodiments of the present invention, the method is also applicable to a packing bag formed of two or more than two layers of packing material. Referring now to FIGS. 5 and 9, when two layers of packing material (including a first layer 91 of packing material and a second layer 92 of packing material) are used to form the packing bag 87, the RFID tags 70 can be attached to the second layer 92 of packing material according to the steps shown in FIG. 3. After that, the tag fixing mechanism 83 is driven to bond a substrate portion of the RFID tags 70 that is provided with neither an antenna nor a chip to the second layer 92 of packing material with a melting technology (such as high-frequency melting or thermo-pressure melting). Then, the first sealing mechanism 84 and the second sealing mechanism 85 of the packing bag forming device 8 are driven to longitudinally and transversely seal two opposite side edges of the first and second layers 91, 92 of packing material with a melting technology, respectively and sequentially, so that the first and second layers 91, 92 of packing material are longitudinally and transversely sealed into semi-finished products of a plurality of packing bags. Finally, the cutting mechanism 86 is driven to equidistantly and transversely cut off the first and second layers 91, 92 of packing material, so as to consistently form a plurality of the packing bags 87, each of which has an inner side surface securely installed with one of the RFID tags 70 at a predetermined position thereon. Similarly, referring now to FIGS. 5 and 10, when four layers of packing material (including a first layer 101 of packing material, a second layer 102 of packing material, a third layer 103 of packing material, and a fourth layer 104 of packing material) are used to form the packing bag, the RFID tags 70 can be attached to the second layer 102 of packing material according to the steps shown in FIG. 3. After that, the tag fixing mechanism 83 is driven to bond a substrate portion of the RFID tags 70 that is provided with neither an antenna nor a chip to the second layer 102 of packing material with a melting technology. Then, the first sealing mechanism 84 and the second sealing mechanism 85 of the packing bag forming device 8 are driven to longitudinally and transversely seal two opposite side edges of the first, second, third, and fourth layers 101-104 of packing material with a melting technology, respectively and sequentially, so that the first, second, third, and fourth layers 101-104 of packing material are longitudinally and transversely sealed into semi-finished products of a plurality of packing bags. Finally, the cutting mechanism 86 is driven to equidistantly and transversely cut off the first, second, third, and fourth layers 101-104 of packing material, so as to consistently form a plurality of the packing bags 87, each of which has an embedded portion or an outer or inner side surface securely installed with one of the RFID tags 70 at a predetermined position thereon. It should be noted that the embodiments shown in FIGS. 9 and 10 only demonstrate a case where the RFID tags 70 are secured on an embedded portion or an inner side surface of the packing bags 87. However, implementation of the present invention is not limited to such a case. In alternative embodiments of the present invention, the RFID tags 70 can also be mounted on an outer side surface of the packing bags 87.

Referring back to FIGS. 5 and 6, in another preferred embodiment of the present invention, a packing bag forming device 8 for forming a radio frequency identification (RFID) tag on a packing bag is also provided, wherein the packing bag forming device 8 comprises a tag peeling mechanism 81, a tag transferring mechanism 82, a tag fixing mechanism 83, a folding mechanism (a traditional mechanism that does not constitute a major feature of the present invention and is therefore not shown in FIGS. 5 and 6), a first sealing mechanism 84, a second sealing mechanism 85, and a cutting mechanism 86. The tag peeling mechanism 81 comprises a plurality of rollers 811, 812, 813 and a separation plate 814, wherein the rollers 811-813 are used to guide a release film 71 of a roll of tag web 7 to a first side of the separation plate 814 for moving the release film 71 along a feeding direction of a packing material 80 in the packing bag forming device 8, and to guide the release film 71 to a second side of the separation plate 814 when the release film 71 approaches a side surface of the packing material 80, so that the release film 71 is moved along a reverse direction of the feeding direction of the packing material 80, thereby peeling RFID tags 70 equidistantly and longitudinally arranged on the release film 71 from the release film 71 due to an abrupt change of a moving direction of the release film 71, while the peeled RFID tag 70 continue to move along the feeding direction of the packing material 80. The tag transferring mechanism 82 comprises a pressing roller 821 and a driving element 822, wherein the pressing roller 821 is disposed at a position adjacent to an end edge of the separation plate 814, and controlled by the driving element 822 so as to move regularly and intermittently. When one of the RFID tags 70 is peeled from the release film 71, the pressing roller 821 can shift and abut against an upper surface of the RFID tag 70, so that an adhesive layer 701 on a lower surface of the RFID tag 70 is attached to the side surface of the packing material 80 due to a pressing force of the pressing roller 821. The tag fixing mechanism 83 comprises a melting mold 831 (such as a mold for high-frequency melting or a mold for thermo-pressure melting) and a forming plate 832, wherein the melting mold 831 is disposed at a position corresponding to the forming plate 832, for bonding a substrate portion of the RFID tag 70 that is provided with neither an antenna nor a chip to the packing material 80 with a melting technology when the RFID tag 70 and the packing material 80 are passed through between the melting mold 831 and the forming plate 832, so as to secure and equidistantly and longitudinally arrange the RFID tags 70 at predetermined positions on the side surface of the packing material 80. The folding mechanism is used to fold the packing material 80 so that the packing material 80 covers two side surfaces of the forming plate 832. Thus, referring to FIGS. 7 and 8, two opposite side edges 801 of the packing material 80 are folded to overlap each other, so that one of two side surfaces of the packing material 80 that is attached with the RFID tags 70 becomes, after being folded, an outer or inner side surface of a packing bag. The first and second sealing mechanisms 84, 85 are, as described above, used to longitudinally and transversely seal the two opposite folded and overlapped side edges 801 of the packing material 80 with a melting technology, respectively and sequentially, so as to continuously form semi-finished products of a plurality of packing bags on the packing material 80, wherein each of the packing bags has an outer or inner side surface securely installed with one of the RFID tags 70 at a predetermined position thereon. The cutting mechanism 86 is used to cut off, one by one, the semi-finished products of packing bags that are longitudinally linked one after another, so as to consistently form a plurality of packing bags 87, each of which has an outer or inner side surface securely installed with one of the RFID tags 70 at a predetermined position thereon.

Figure 7:
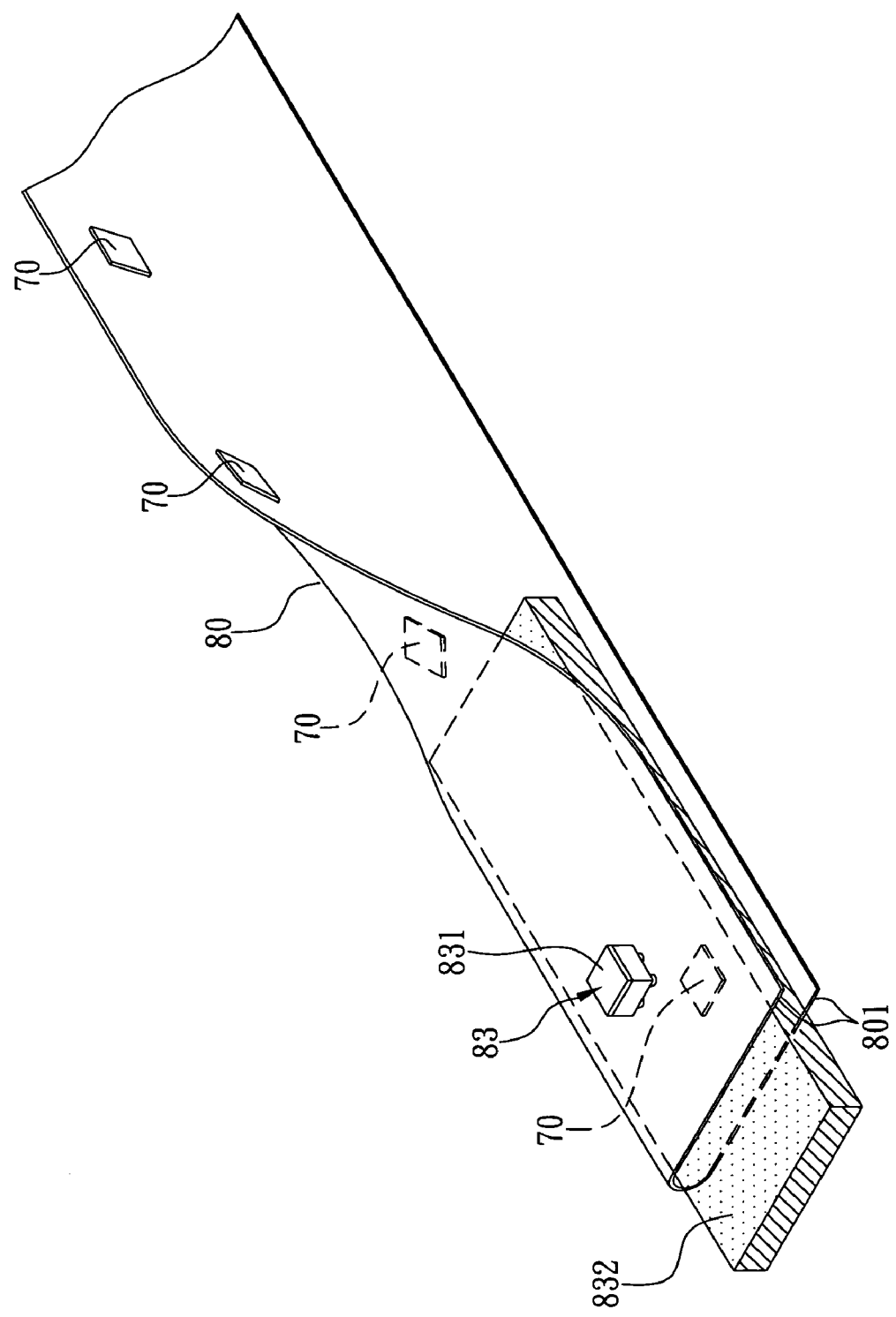
FIG. 7 is a schematic view of a cylindrical packing material having two opposite side edges folded to overlap each other for forming a side sealed portion according to a preferred embodiment of the present invention.
Figure 8:
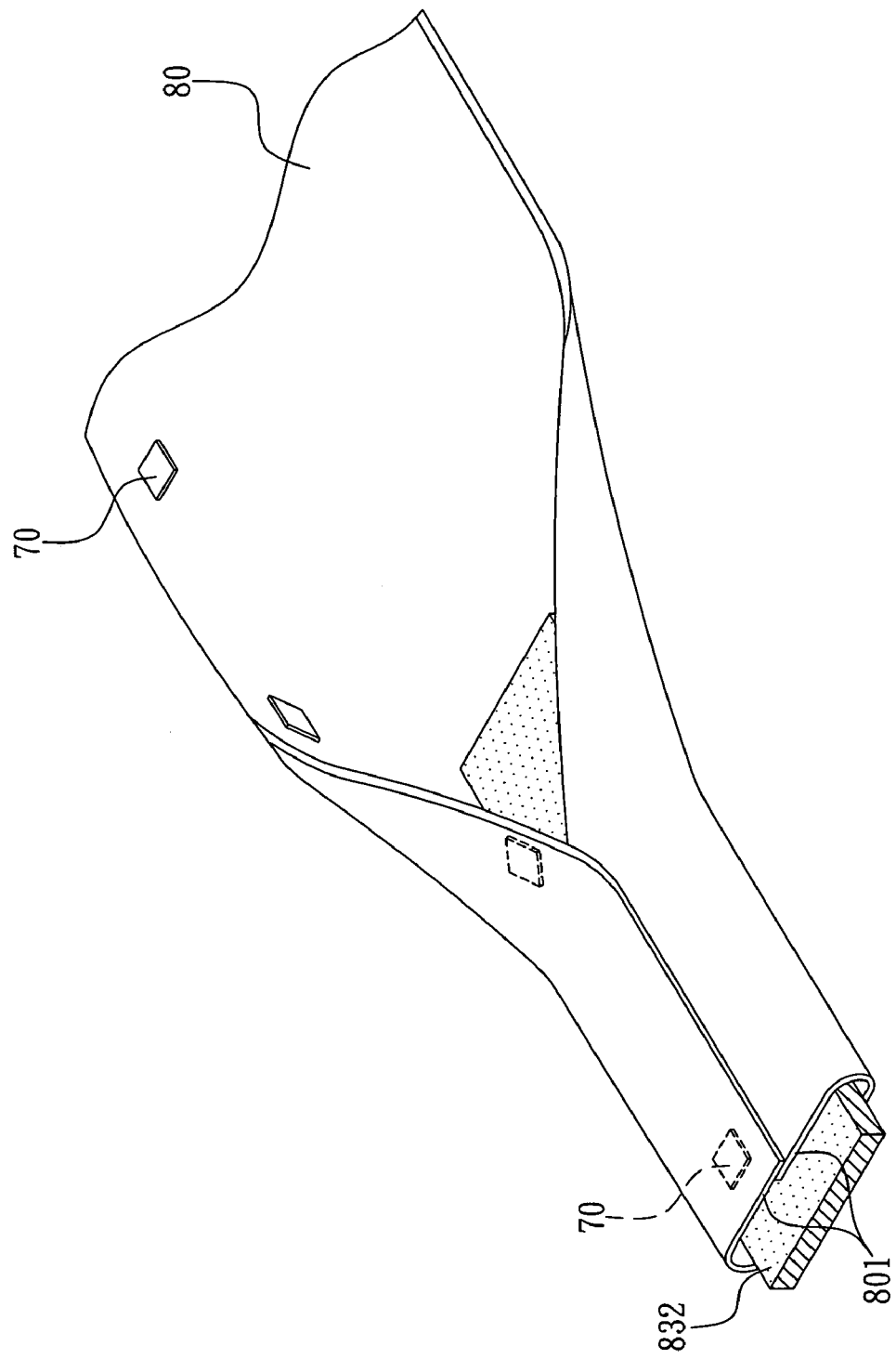
FIG. 8 is a schematic view of a cylindrical packing material having two opposite side edges folded to overlap each other for forming a central sealed portion according to a preferred embodiment of the present invention.
Figure 10:
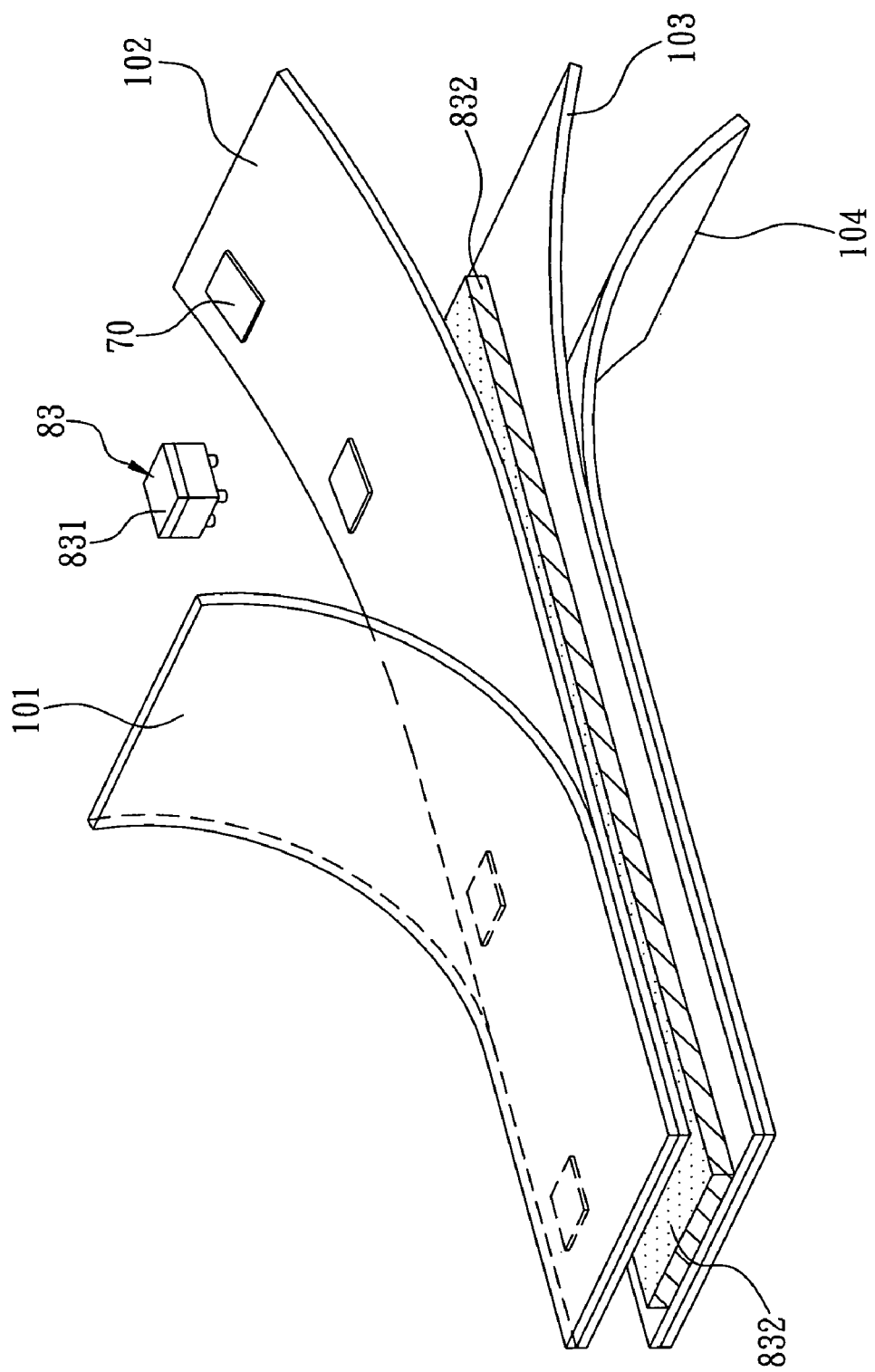
FIG. 10 is a schematic view of four layers of packing material used to form packing bags according to a preferred embodiment of the present invention.

The packing bag forming device 8 of the present invention is characterized by the tag peeling mechanism 81, the tag transferring mechanism 82, and the tag fixing mechanism 83, while the remaining mechanisms (i.e., the folding mechanism, the first sealing mechanism 84, the second sealing mechanism 85, and the cutting mechanism 86) are traditional mechanisms which may have different designs depending on whether they are used to form packing bags having a single layer of packing material (as shown in FIGS. 7 and 8), two layers of packing material (as shown in FIG. 9), or more than two layers of packing material (as shown in FIG. 10). However, whatever the designs, the folding mechanism, the first sealing mechanism 84, the second sealing mechanism 85, and the cutting mechanism 86 have been widely used in traditional packing bag forming devices. Therefore, the present invention can be implemented simply by adding the tag peeling mechanism 81, the tag transferring mechanism 82, and the tag fixing mechanism 83 to a traditional packing bag forming device without having to substantially change existing designs of the folding mechanism, the first sealing mechanism 84, the second sealing mechanism 85, and the cutting mechanism 86 in the traditional packing bag forming device. Thus, the packing bag forming device 8 of the present invention can be provided with a lowest production cost and a shortest retrofitting time. As a result, the present invention can carry out a consistent operation to not only form packing bags, but also simultaneously form RFID tags at predetermined positions on an outer or inner side surface of the packing bags.

The present invention has been described with preferred embodiments thereof and it is understood that many changes and modifications to the described embodiment can be carried out without departing from the scope and the spirit of the invention that are defined only by the appended claims.

What is claimed is:

1. A packing bag forming device for forming a radio frequency identification (RFID) tag on a packing bag, comprising:
   a tag peeling mechanism comprising a plurality of rollers and a separation plate, wherein the rollers are used to guide a release film of a roll of tag web to a first side of the separation plate for moving the release film along a feeding direction of a packing material in the packing bag forming device, and to guide the release film to a second side of the separation plate when the release film approaches a side surface of the packing material, so as to move the release film along a reverse direction of the feeding direction of the packing material, thereby peeling RFID tags equidistantly and longitudinally arranged on the release film from the release film due to an abrupt change of a moving direction of the release film, while the peeled RFID tags continue to move along the feeding direction of the packing material;
   a tag transferring mechanism comprising a pressing roller and a driving element, wherein the pressing roller is disposed at a position adjacent to an end edge of the separation plate, and controlled by the driving element to regularly and intermittently move, and wherein the pressing roller can shift and abut against an upper surface of the RFID tags when the RFID tags are peeled from the release film, so that an adhesive layer on a lower surface of the RFID tags is attached to the side surface of the packing material due to a pressing force of the pressing roller;
   a tag fixing mechanism comprising a melting mold and a forming plate, wherein the melting mold is disposed at a position corresponding to the forming plate, for bonding a substrate portion of the RFID tags which is provided with neither an antenna nor a chip to the packing material with a melting technology when the RFID tags and the packing material are passed through between the melting mold and the forming plate, so as to secure and equidistantly and longitudinally arrange the RFID tags at predetermined positions on the side surface of the packing material;
   a folding mechanism for folding two opposite side edges of the packing material, so that the two opposite side edges overlap each other, and one of two side surfaces of the packing material that is attached with the RFID tags becomes, after being folded, an inner side surface of a packing bag;
   a sealing mechanism for sealing the two opposite side edges of the packing material with a melting technology, so as to continuously and longitudinally form a plurality of packing bags from the packing material, wherein each of the packing bags has an outer or inner side surface securely installed with one of the RFID tags at a predetermined position thereon; and
   a cutting mechanism for equidistantly and transversely cutting off, one by one, the packing bags which are longitudinally linked one after another, so as to complete the plurality of packing bags.

2. The packing bag forming device of claim 1, wherein the two opposite side edges of the packing material are folded by the folding mechanism, so that the packing material is folded into a cylindrical packing material for longitudinally forming a side sealed portion.

3. The packing bag forming device of claim 1, wherein the two opposite side edges of the packing material are folded by the folding mechanism, so that the packing material is folded into a cylindrical packing material for longitudinally forming a central sealed portion.

4. The packing bag forming device of claim 2, wherein the sealing mechanism comprises a first sealing mechanism for longitudinally sealing the two opposite folded and overlapped side edges of the packing material with a melting technology, and a second sealing mechanism for equidistantly and transversely sealing the cylindrical packing material with a melting technology, so as to form the plurality of packing bags longitudinally linked one after another.

5. The packing bag forming device of claim 3, wherein the sealing mechanism comprises a first sealing mechanism for longitudinally sealing the two opposite folded and overlapped side edges of the packing material with a melting technology, and a second sealing mechanism for equidistantly and transversely sealing the cylindrical packing material with a melting technology, so as to form the plurality of packing bags longitudinally linked one after another.

6. A packing bag forming device for forming a radio frequency identification (RFID) tag on a packing bag, comprising:
   a tag peeling mechanism comprising a plurality of rollers and a separation plate, wherein the rollers are used to guide a release film of a roll of tag web to a first side of the separation plate for moving the release film along a feeding direction of a first layer of packing material in the packing bag forming device, and to guide the release film to a second side of the separation plate when the release film approaches an inner side surface of the first layer of packing material, so as to move the release film along a reverse direction of the feeding direction of the first layer of packing material, thereby peeling RFID tags equidistantly and longitudinally arranged on the release film from the release film due to an abrupt change of a moving direction of the release film, while the peeled RFID tags continue to move along the feeding direction of the first layer of packing material;
   a tag transferring mechanism comprising a pressing roller and a driving element, wherein the pressing roller is disposed at a position adjacent to an end edge of the separation plate, and controlled by the driving element to regularly and intermittently move, and wherein the pressing roller can shift and abut against an upper surface of the RFID tags when the RFID tags are peeled from the release film, so that an adhesive layer on a lower surface of the RFID tags is attached to the inner side surface of the first layer of packing material due to a pressing force of the pressing roller;
   a tag fixing mechanism comprising a melting mold and a forming plate, wherein the melting mold is disposed at a position corresponding to the forming plate, for bonding a substrate portion of the RFID tag that is provided with neither an antenna nor a chip to the first layer of packing material with a melting technology when the RFID tags and the first layer of packing material are passed through between the melting mold and the forming plate, so as to secure and equidistantly and longitudinally arrange the RFID tags at predetermined positions on the inner side surface of the first layer of packing material;
   a sealing mechanism for sealing two opposite side edges of the first layer of packing material and two opposite side edges of at least one second layer of packing material with a melting technology, so as to continuously form a plurality of packing bags from the first and second layers of packing material, wherein each of the packing bags has an outer or inner side surface securely installed with one of the RFID tags at a predetermined position thereon; and a cutting mechanism for equidistantly and transversely cutting off, one by one, the packing bags which are longitudinally linked one after another, so as to complete the plurality of packing bags.

7. The packing bag forming device of claim 6, wherein the sealing mechanism comprises a first sealing mechanism for longitudinally sealing the two opposite side edges of the first layer of packing material and of the second layer of packing material with a melting technology, and a second sealing mechanism for equidistantly and transversely sealing the first and second layers of packing material with a melting technology, so as to form the plurality of packing bags longitudinally linked one after another.

* * * * *